United States Patent
Chan et al.

(10) Patent No.: US 10,790,141 B2
(45) Date of Patent: Sep. 29, 2020

(54) SURFACE-SELECTIVE ATOMIC LAYER DEPOSITION USING HYDROSILYLATION PASSIVATION

(71) Applicant: Applied Materials, Inc., Santa Clara, CA (US)

(72) Inventors: Kelvin Chan, San Ramon, CA (US); Yihong Chen, San Jose, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/755,428

(22) PCT Filed: Sep. 15, 2016

(86) PCT No.: PCT/US2016/051868
§ 371 (c)(1),
(2) Date: Feb. 26, 2018

(87) PCT Pub. No.: WO2017/048911
PCT Pub. Date: Mar. 23, 2017

(65) Prior Publication Data
US 2018/0254179 A1 Sep. 6, 2018

Related U.S. Application Data

(60) Provisional application No. 62/221,007, filed on Sep. 19, 2015.

(51) Int. Cl.
*H01L 21/02* (2006.01)
*C23C 16/04* (2006.01)
(Continued)

(52) U.S. Cl.
CPC .......... *H01L 21/0228* (2013.01); *C23C 16/04* (2013.01); *C23C 16/345* (2013.01); *C23C 16/45525* (2013.01); *C23C 16/45536* (2013.01); *H01L 21/0217* (2013.01); *H01L 21/02186* (2013.01); *H01L 21/02271* (2013.01);
(Continued)

(58) Field of Classification Search
None
See application file for complete search history.

(56) References Cited

U.S. PATENT DOCUMENTS

2006/0199399 A1 9/2006 Muscat
2007/0098894 A1 5/2007 Verghese et al.
(Continued)

FOREIGN PATENT DOCUMENTS

JP 2013079447 A 5/2013

OTHER PUBLICATIONS

PCT International Preliminary Report on Patentability in PCT/US2016/051868 dated Mar. 29, 2018, 7 pages.
(Continued)

*Primary Examiner* — Moazzam Hossain
*Assistant Examiner* — Stanetta D Isaac
(74) *Attorney, Agent, or Firm* — Servilla Whitney LLC

(57) ABSTRACT

Methods for selectively depositing films by atomic layer deposition are disclosed. Substrate surfaces are passivated by hydrosilylation to prevent deposition and allow selective deposition on unpassivated surfaces.

17 Claims, 2 Drawing Sheets

(51) Int. Cl.
  *C23C 16/34* (2006.01)
  *H01L 21/285* (2006.01)
  *H01L 21/306* (2006.01)
  *H01L 21/768* (2006.01)
  *C23C 16/455* (2006.01)
  *H01L 21/32* (2006.01)

(52) U.S. Cl.
  CPC ...... *H01L 21/28562* (2013.01); *H01L 21/306* (2013.01); *H01L 21/32* (2013.01); *H01L 21/76826* (2013.01); *H01L 21/76829* (2013.01)

(56) References Cited

U.S. PATENT DOCUMENTS

| | | | |
|---|---|---|---|
| 2007/0108404 A1* | 5/2007 | Stewart | C11D 7/08 252/79.1 |
| 2008/0242097 A1 | 10/2008 | Boescke et al. | |
| 2008/0274282 A1* | 11/2008 | Bent | C23C 16/04 427/255.28 |
| 2013/0084700 A1 | 4/2013 | Swerts et al. | |

OTHER PUBLICATIONS

PCT International Search Report and Written Opinion in PCT/US2016/051868 dated Dec. 20, 2016, 10 pages.

Hong, Junsic, et al., "ALD Resist Formed by Vapor-Deposited Self-Assembled Monolayers", Langmuir 2007, vol. 23, No. 3, pp. 1160-1165.

* cited by examiner

SURFACE-SELECTIVE ATOMIC LAYER DEPOSITION USING HYDROSILYLATION PASSIVATION

CROSS-REFERENCE TO RELATED APPLICATIONS

This application is the National Stage entry of PCT/US16/51868, filed on Sep. 15, 2016, which claims priority to U.S. Provisional Ser. No. 62/221,007, filed on Sep. 19, 2015, which are incorporated herein by reference in their entireties.

FIELD

Embodiments of the present disclosure generally relate to atomic layer deposition methods. More specifically, embodiments of the disclosure relate to surface-selective atomic layer deposition in which a surface is passivated by hydrosilylation.

BACKGROUND

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, use an ALD process may be beneficial. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form a uniform material layer on the surface of a substrate. Cycles of reactive precursor and inert purge gases are repeated to form the material layer to a predetermined thickness.

Conventionally, atomic layer deposition is a non-selective technique that deposits on all surfaces. There is a need in the art for methods of selectively depositing films on substrates.

SUMMARY

One or more embodiments of the disclosure are directed to methods of depositing a film. A substrate comprising a first substrate surface including a hydrogen-terminated surface and a second substrate surface including a non-hydrogen-terminated surface is provided. The substrate is exposed to a passivating agent to react with the hydrogen-terminated surface to form a passivated surface. The passivating agent comprises an organic species with at least one unsaturated carbon-carbon bond. The substrate is exposed to one or more deposition gases to selectively deposit a film on the second substrate surface relative to the passivated surface.

Additional embodiments of the disclosure are directed to methods of depositing a film. A substrate comprising a first substrate surface including a hydrogen-terminated surface and a second substrate surface including a non-hydrogen-terminated dielectric is provided. The substrate is exposed to a passivating agent to react with the hydrogen-terminated surface to form a passivated surface. The passivating agent comprises an organic silane with at least one unsaturated carbon-carbon bond. The substrate is exposed to one or more deposition gases to deposit a silicon nitride film on the second substrate surface selectively over the first passivated surface.

Further embodiments of the disclosure are directed to methods of depositing a film. A substrate comprising a first substrate surface and a second substrate surface is provided. The substrate is exposed to dilute HF to remove an oxide from the first substrate surface to provide a hydrogen-terminated surface. The second substrate surface comprises a non-hydrogen-terminated surface. The substrate is exposed to a passivating agent to react with the hydrogen-terminated surface to form a passivated surface. The passivating agent comprises trimethylvinylsilane. The substrate is sequentially exposed to a first reactive gas and a second reactive gas to selectively deposit a SiN film on the second substrate surface relative to the passivated surface. The first reactive gas comprises silicon tetrachloride and the second reactive gas comprises ammonia.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. The appended drawings illustrate only typical embodiments of this disclosure and are therefore not to be considered limiting, for the disclosure may admit to other equally effective embodiments.

DETAILED DESCRIPTION

Figure 1:
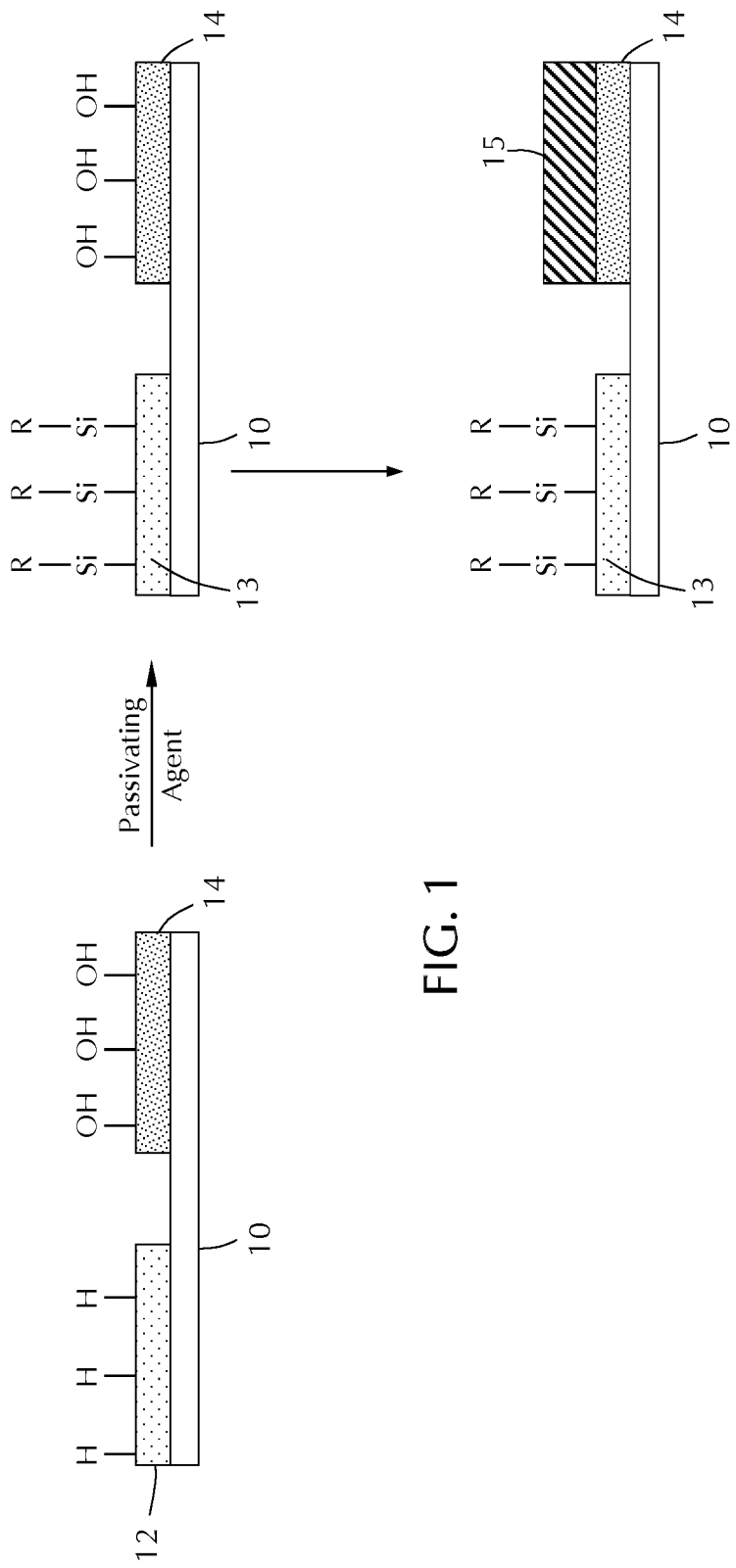
FIG. 1 shows a schematic representation of a processing method in accordance with one or more embodiment of the disclosure.

Embodiments of the disclosure provide deposition methods for selective atomic layer deposition (ALD). Embodiments of the disclosure relates to the use of passivation to affect deposition selectivity. Conventionally, ALD is non-selective and deposits on all surfaces. Some technique to discourage the attachment of one of the ALD co-reactants could affect selectivity. Such a technique is effective when it is surface-selective and discourages attachment on only the surface where deposition is not desired.

One or more embodiments of the disclosure provide methods for selectively depositing a film on one portion of a substrate preferentially relative to a second portion of the substrate. Some embodiments of the disclosure provide methods for passivating one surface type to allow selective deposition. One or more embodiments of the disclosure provide reversible surface passivation processes for selective deposition.

In some embodiments, the method uses hydrosilylation to passivate Si surfaces with organosilicon or organic species that discourage the attachments of precursors used for ALD. For example, on a substrate where SiN, SiO, and Si surfaces are present, the Si surface can be passivated before ALD is performed. The end result is that ALD occurs substantially only on the SiN and SiO surfaces but not on Si.

In some embodiments of the method, native oxides are removed from the surface to create SiH on the Si surface. Removal of the native oxide can be done by any suitable technique including, but not limited to, dipping the substrate in 100:1 dilute HF. After the dilute HF dip, the Si can be terminated with SiH. The SiN and SiO surfaces are not terminated with SiH (SiN terminated with SiF and SiOH; SiO terminated with SiOH).

The substrate can then be transferred to another vessel or chamber where hydrosilyation can be performed. The hydrosilylation may be done in gas or liquid phase, with or without catalyst and with or without UV exposure. For example, without being bound by theory, in the gas phase trimethylvinylsilane (TMVS) is passed into a chamber where the substrate is placed. Under UV illumination, hydrosilyation occurs through the reaction of SiH with TMVS changing SiH into $SiCH_2CH_2Si(CH_3)_3$. No such reaction occurs on SiO and SiN surfaces because these surfaces do not have SiH.

After hydrosilylation, the substrate can be transferred into an ALD chamber where thermal ALD can be performed. For example, in a spatial ALD chamber, thermal ALD of silicon nitride with the use of $SiCl_4$ and $NH_3$ can be performed. Again, without being bound by theory, it is believed that the presence of $SiCH_2SH_2Si(CH_3)_3$ moiety on the Si surface (i.e., the passivation), the attachment of $SiCl_4$ is discouraged, leading to no ALD or reduced amount of ALD on the Si surface. This passivation is not present on the SiN and SiO surfaces; therefore ALD growth is not discouraged nor retarded on these surfaces. The overall outcome is that more ALD silicon nitride is formed on SiN and SiO then is formed on Si. Stated differently, the film is selectively deposited on the SiN and SiO surfaces relative to the Si surface.

Other thermal ALD systems may be employed including, but not limited to, silicon nitride, TiO, TiN, TaN, MnN. Other passivation molecules may be used (not limited to TMVS). Examples include, but are not limited to, vinylsilanes, alkenes, and alkynes.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface will comprise a metal, and the second substrate surface will comprise a dielectric, or vice versa. In some embodiments, a substrate surface may comprise certain functionality (e.g., —OH, —NH, etc.).

Substrates for use with the embodiments of the disclosure can be any suitable substrate. In some embodiments, the substrate is a rigid, discrete, generally planar substrate. As used in this specification and the appended claims, the term "discreet" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire or silicon carbide.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of selectively depositing a metal film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film or none. The term "over" used in this regard does not imply a physical orientation of one surface on top of another surface, rather a relationship of the thermodynamic or kinetic properties of the chemical reaction with one surface relative to the other surface. For example, selectively depositing a silicon nitride film onto a dielectric surface over a silicon surface means that the silicon nitride film deposits on the dielectric surface and less or no SiN deposits on the Si surface; or that the formation of the SiN film on the dielectric surface is thermodynamically or kinetically favorable relative to the formation of a SiN film on the Si surface.

With reference to FIG. 1, one or more embodiments of the disclosure are directed to methods of depositing a film. A substrate 10 comprising a first substrate surface 12 and a second substrate surface 14 is provided. The first substrate surface 12 includes a hydrogen-terminated surface (i.e., a surface having —H groups). The second substrate surface 14 includes a non-hydrogen-terminated surface (i.e., a surface that does not have —H terminations). Some examples of non-hydrogen-terminated surfaces include, but are not limited to, —OH and —$NH_2$. In some embodiments, the first substrate surface 12 comprises substantially only hydrogen-terminations. As used in this regard, the term "substantially only" means that the surface terminations of the first substrate surface are at least about 75%, 80%, 85%, 90% or 95% hydrogen-terminations. In some embodiments, the second substrate surface 14 comprises substantially only non-hydrogen-terminations. As used in this regard, the term "substantially only" means that the surface terminations of the second substrate surface are at least about 75%, 80%, 85%, 90% or 95% non-hydrogen terminations. In some embodiments, one or more of the first substrate surface 12 and the second substrate surface 14 comprises a dielectric. In one or more embodiments, the first substrate surface 12 comprises silicon and the second substrate surface 14 comprises a dielectric. The dielectric can be a low-k dielectric or a high-k dielectric.

The substrate 10 is exposed to a passivating agent to react with one or more of the first substrate surface 12 and/or the second substrate surface 14. Exposing the substrate surface to the passivating agent can be done by any suitable process. Exposure may be referred to as soaking, in which at least some of the substrate surfaces are "soaked" or "flooded" with the passivating agent to allow surface reactions to occur. As used in this specification and the appended claims, the term "passivating agent" refers to a compound that forms a layer that protects the surface from unintentional subsequent reactions. FIG. 1 shows a schematic of the initial surface reactions that occur on an Si—H terminated surface (the first substrate surface 12) versus a Si—OH terminated surface (the second substrate surface 14).

Silicon-carbon bonds are very strong and not very reactive. Without being bound by any particular theory of operation, it is believed that hydrosilylation can deactivate a surface by formation of a silicon-carbon bond. Silicon-carbon bonds are also thermally stable, showing stability up to about 600° C. or higher.

The passivating agent reacts with the hydrogen-terminations on the first substrate surface 12 to form a passivated surface 13. Suitable passivating agents are those that can react with the surface hydrogen groups to form a passivated surface. In some embodiments, the passivating agent comprises an organic species with at least one unsaturated carbon-carbon bond. The unsaturated carbon-carbon bond can be a double bond or a triple bond. In some embodiments, the unsaturated carbon-carbon bond is a double bond. In one or more embodiments, the unsaturated carbon-carbon bond is a triple bond. In some embodiments, the passivating agent comprises more than on unsaturated bond. In one or more embodiments, the passivating agent comprises substantially no species without unsaturated carbon-carbon bonds. As used in this regard, "substantially no" means that less than about 10%, 5%, 2% or 1% of the species in the passivating agent have no unsaturated carbon-carbon bonds. Those skilled in the art will understand that the passivating agent can be diluted or carried into the processing chamber with a carrier gas. The carrier gas can be any suitable non-reactive species and is not considered part of the passivating agent. The passivating agent of some embodiments is one or more of a vinyl, alkene or alkyne.

The passivating agent can be any unsaturated organic compound having the generic formula $C_xH_y$ with at least one unsaturated carbon-carbon bond. Suitable examples include, but are not limited to, 1-octene or 1,4-cyclooctadiene. The passivating agent can be any linear, branched or cyclic unsaturated organic compound.

The passivating agent can be an organic silane having the general formula $Si_xC_yH_z$ with at least one unsaturated carbon-carbon bond. The organic silane can be, for example, a vinylsilane, a silylalkene or a silylalkyne. In some embodiments, the organic silane comprises trimethylvinylsilane.

In one or more embodiments, the organic silane comprises a silicon atom bonded substantially only to carbon atoms. As used in this specification and the appended claims, the term "substantially only to carbon" means that there is less than about 5% of the silicon atoms are bonded to atoms other than carbon, on an atomic basis. In one or more embodiments, the organic silane comprises substantially no Si—H or Si—OH bonds. As used in this specification and the appended claims, the term "substantially no Si—H and/or Si—OH bonds" means that there is less than about 5% of the silicon atoms are bonded to hydrogen or hydroxides.

The temperature at which the passivating agent is exposed to the substrate surfaces depends on, for example, the first surface, the second surface, the passivating agent, planned future processing, past processing and the processing equipment being used. For example, a lower temperature process may help preserve the thermal budget of the substrate for further processing. In some embodiments, the substrate surfaces are exposed to the passivating agent at a temperature in the range of about 50° C. to about 600° C.

The passivating agent exposure time can vary depending on, for example, the reactivity of the passivating agent toward the subject surface materials. In some embodiments, the substrate is exposed to the passivating agent for a time in the range of about 10 seconds to about 60 minutes. In some embodiments, the passivating agent exposure occurs for a time less than about 10 minutes, 5 minutes, 1 minute or 0.5 minutes.

The temperature of the passivation process, and optionally the deposition process, can be varied depending on, for example, the precursors being used. Each portion of the process can occur at a different temperature than other portions of the process. In some embodiments, the process occurs at a temperature in the range of about 200° C. to about 650° C., or in the range of about 300° C. to about 600° C., or in the range of about 400° C. to about 550° C.

The surface passivation can occur at any pressure suitable depending on, for example, the temperature and passivating agent. The pressure of some embodiments is in the range of about 0.01 torr to about 760 torr, or in the range of about 0.1 torr to about 100 torr, or about 10 torr.

The passivating agent can be flowed into the processing chamber in any carrier gas. In some embodiments, the carrier gas comprises one or more of argon, helium and/or nitrogen. The flow of the passivating agent is in the range of about 1 sccm to about 30,000 sccm, or in the range of about 100 sccm to about 10,000 sccm or about 1000 sccm. The passivating agent can be delivered to the substrate in the range of about 0.01 g/min to about 4 g/min, or about 1 g/min.

After formation of the passivated surface 13, a film can be deposited onto the second substrate surface 14 without affecting the passivated surface 13. The film can be deposited by any suitable technique. In some embodiments, the substrate 10 is exposed to one or more deposition gases to deposit a film 15 on the second substrate surface 14 selectively versus the passivated surface 13.

In some embodiments, the first substrate surface 12 comprises silicon. In one or more embodiments, the second substrate surface 14 comprises one or more of SiO and/or SiN. In some embodiments, the substrate 10 further comprises a third substrate surface, where the second substrate surface 14 comprising SiO and the third substrate surface comprising SiN. In some embodiments, the passivated surface comprises SiH and the second surface comprises SiOH.

In some embodiments, the method further comprises removing an oxide from the first substrate surface to produce the hydrogen-terminated surface. The first substrate surface may have an oxide formed by exposure to atmosphere (a native oxide) or by oxidation. In some embodiments, the oxide is a native oxide. The oxide can be removed by any suitable method. In some embodiments, removing the oxide from the first substrate surface comprises exposing the surface to dilute HF. Dilute HF can be, for example, a 1% HF solution.

In some embodiments, the film formed after passivation comprises one or more of SiN, TiO, TiN, TaN and/or MnN.

In one or more embodiments, the deposited film 15 comprises SiN. The film 15 of some embodiments is deposited by atomic layer deposition comprising sequential exposure to a silicon-containing gas and a nitrogen-containing gas. Suitable silicon-containing gases include, but are not limited to silane, disilane, trisilane, monochlorosilane, dichlorosilane, trichlorosilane, silicon tetrachloride, hexachlorodisilane (HCDS), a halogenated carbosilane and combinations thereof. Suitable nitrogen-containing gases include, but are not limited to, nitrogen-containing plasma, ammonia, an amine, hydrazine and/or carbonitride.

The film formation process can be CVD process in which the first reactive gas and the second reactive gas are exposed to the substrate surface at the same time so that the first reactive gas and the second reactive gas mix during formation of the film.

In some embodiments, the film formation process is an ALD process in which the substrate, or portion of the substrate, is sequentially exposed to the first reactive gas and the second reactive gas. Sequential exposure means that the substrate, or portion of the substrate, is exposed to only one of the first reactive gas and the second reactive gas at any given time. In ALD processes there is substantially no gas phase mixing of the first reactive gas and the second reactive gas.

Figure 2:
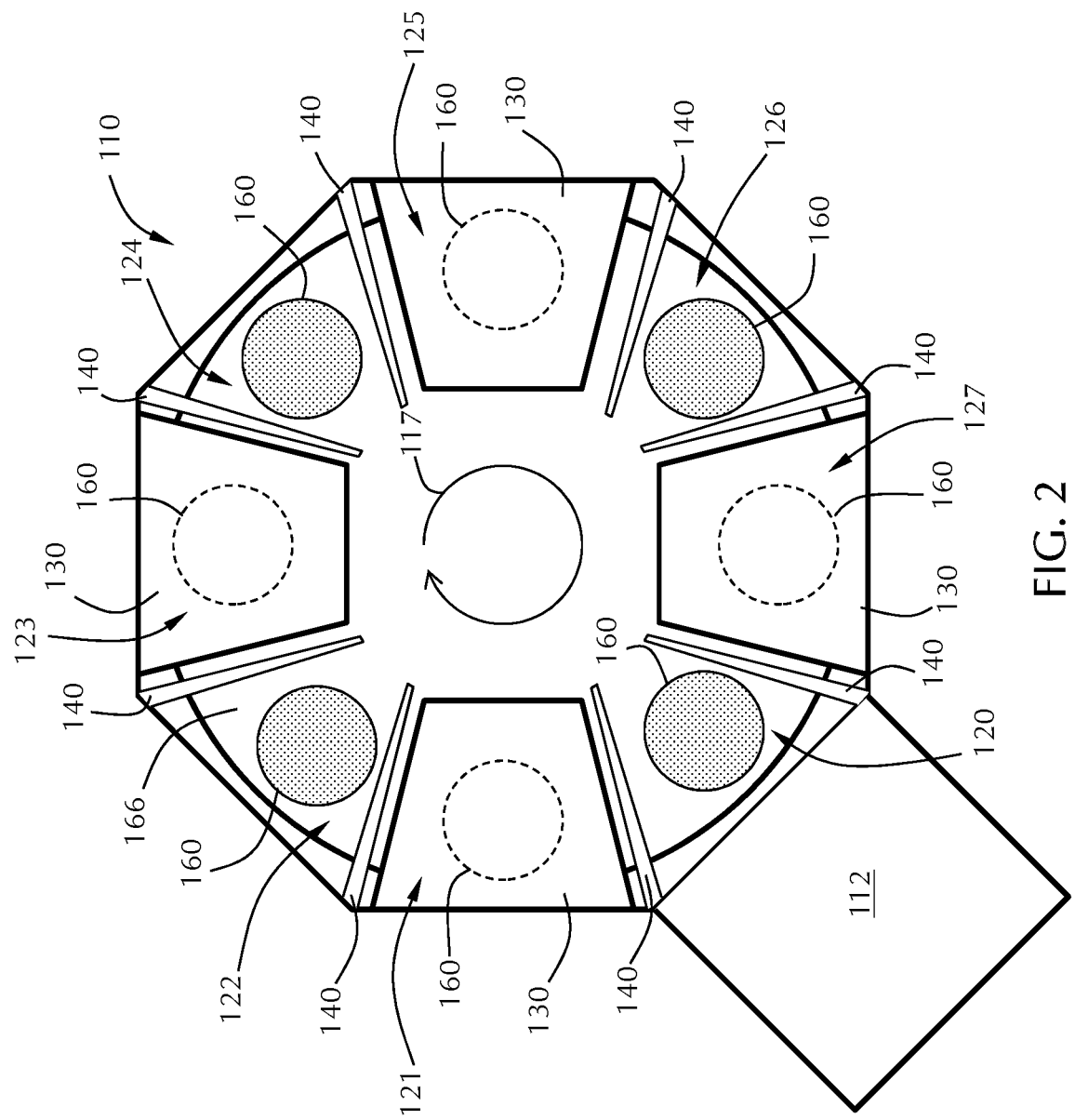
FIG. 2 shows an embodiment of a batch processing chamber in accordance with one or more embodiment of the disclosure.

FIG. 2 shows an embodiment of a spatial atomic layer deposition batch processor, referred to as a processing chamber 110. The shape of the processing chamber 110 and the components described are merely exemplary and should not be taken as limiting the scope of the disclosure. For example the octagonal shaped processing chamber can be circular or hexagonal, etc. A load lock 112 chamber is connected to a front (which may be arbitrarily designated as the front) of the processing chamber 110 and provides a way of isolating the interior of the processing chamber from the atmosphere outside of the processing chamber 110. Load lock 112 can be any suitable load lock, and can operate in the manner as any suitable load lock, as is known to those skilled in the art.

A substrate 160 passes into the processing chamber 110 into a loading region 120. In the loading region 120, the substrate 160 can be subjected to processing conditions or can rest. Processing conditions in the loading region can be, for example, pre-heating of the substrate 160 to process temperature, exposure to a passivating agent.

The substrate 160 is moved laterally from the loading region through a gas curtain 140 to a first process region 121. The use of ordinal numbers to describe the process regions is merely exemplary and should not be taken as limiting the scope of the disclosure. Use of the terms "first process region", "second process region", etc., are merely intended as a convenient way of describing different portions of the processing chamber. The specific location of the process regions within the chamber is not limited to the embodiment shown. Lateral movement of the substrate 160 can occur by rotation of a susceptor 166 about an axis indicated by arrow 117, or in the opposite direction of arrow 117. In the first process region 121, the substrate 160 may be exposed a first reactive gas or precursor for an ALD process.

The substrate 160 is moved laterally within the processing chamber 110 from the first process region 121 through a gas curtain 140 to a second process region 122. The gas curtains 140 provide separation between the various process regions within the processing chamber 110. The gas curtains are shown as a wedge shaped component with a truncated inner end but it will be understood that the gas curtain can be any shape suitable for maintaining isolation of the process regions. The gas curtain 140 can include any suitable combination of inert gases and/or vacuum ports that are capable of separating the atmospheres of the individual process regions. In some embodiments, the gas curtains 140 comprise, in order, a vacuum port, an inert gas port and another vacuum port. At some point during movement of the substrate from the first process region 121 to the second process region 122, one portion of the substrate is exposed to the second process region while another portion of the substrate is exposed to the first process region 121 and a center portion is within the gas curtain 140.

Once in the second process region 122, the substrate 160 might be exposed to a second reactive gas that can complete the ALD process. For example, if a SiN film is being formed, the first reactive gas might be a silicon-containing precursor and the second reactive gas might be a nitrogen-containing gas.

The substrate 160 can be continuously laterally moved along the circular path indicated by arrow 117 to expose the substrate to the third process region 123, fourth process region 124, fifth process region 125, sixth process region 126 and the seventh process region 127 and back to the loading region. In some embodiments, the loading region 120, second process region 122, fourth process region 124 and sixth process region 126 each expose the substrate to the second reactive gas comprising an alcohol and the first process region 121, third process region 123, fifth process region 125 and seventh process region 127 each expose the substrate 160 to the first reactive gas. The embodiment shown in FIG. 2 has a wedge shaped gas distribution assembly 130 positioned over the first, third, fifth and seventh process regions for clarity to show the substrate 160 on the susceptor 166 between gas distribution assemblies 130. However, it will be understood that any or all of the process regions can have a gas distribution assembly 130 or other gas delivery system.

Once the film 15 has been deposited, further processing may be performed. For example, de-protection of the first substrate surface 12 may occur to remove the passivation. This can be done by any suitable method or technique that can remove the organic compound from the surface after depositing the film 15 without damaging the deposited film. The further processing can be performed in the same processing chamber or a different processing chamber.

In some embodiments, exposure to the passivating agent is followed by ALD deposition cycles. At some intervals, the passivating agent is etched and a new passivation layer is formed. In some embodiments, the passivation layer is etched after no more than about 300 ALD cycles, or 200 ALD cycles, or 100 ALD cycles, or 75 ALD cycles or 50 ALD cycles. In one or more embodiments, the etch process is performed after every 100 ALD deposition cycles, followed by treatment with the passivating agent again prior to continuing deposition.

In some embodiments, the process occurs in a batch processing chamber.

For example, in a rotating platen chamber, in which one or more wafers are placed on a rotating holder ("platen"). As the platen rotates, the wafers move between various processing areas. For example, in ALD, the processing areas would expose the wafer to precursor and reactants. In addition, plasma exposure may be useful to properly treat the film or the surface for enhanced film growth, or to obtain desirable film properties.

Some embodiments of the disclosure process a substrate with the first surface and the second surface in a single processing chamber where in a first portion of the chamber, the substrate surfaces are exposed to the passivating agent. The substrate may then be rotated to a second portion of the processing chamber, and/or subsequent portion of the processing chamber to deposit a film. In some embodiments, the substrate can be further rotated or moved to another portion of the processing chamber where the passivation layer can be removed. To separate each or any of the portions, or regions, of the processing chamber, a gas curtain can be employed. The gas curtain provides one or more of purge gas and vacuum ports between the processing regions to prevent reactive gases from moving from one region to an adjacent region. In some embodiments, the substrate is exposed to more than one processing region at the same time, with one portion of the substrate in a first region and another portion of the substrate at the same time while in a separate region of the processing chamber.

The individual processes can be performed in separate processing chambers or a single processing chamber as described herein. In some embodiments, each process occurs in a single processing chamber in which the substrate is moved laterally between a plurality of sections, each section separated from adjacent sections by a gas curtain. In embodiments of this sort, trimming the patterned layer occurs in a first section of the processing chamber, depositing the spacer layer occurs in a second section of the processing chamber and etching the spacer layer occurs in a third section of the processing chamber. For example, a processing method of this sort can comprise placing the substrate into a processing chamber comprising a plurality of sections, each section separated from adjacent sections by a gas curtain. At least a portion of the substrate is exposed to a first process condition to trim the patterned layer to reduce the width of the patterned layer. The substrate is laterally moved through a gas curtain to a second section of the processing chamber. In the second section of the processing chamber, at least a portion of the substrate is exposed to a second process condition to deposit the spacer layer over the first layer and the patterned layer. The substrate is then laterally moved through a gas curtain to a third section of the processing chamber. At least a portion of the substrate is then exposed to a third process condition to etch the spacer layer from the top surface of the at least one feature and the portions of the first layer exposed through the patterned layer. During lateral movement of the substrate from the first section to the second section, a first portion of the substrate is exposed to the first process condition at the same time that a second portion of the surface is exposed to the second process conditions and an intermediate portion of the substrate is exposed to the gas curtain. The intermediate portion being some portion of the substrate between the first portion and the second portion. During lateral movement of the substrate from the second section to the third section, a first portion of the substrate is exposed to the second process condition at the same time that a second portion of the substrate is exposed to the third process condition and an intermediate portion of the substrate is exposed to the gas curtain.

Embodiments of the disclosure can be used with either a linear processing system or a rotational processing system. In a linear processing system, the width of the area that the plasma exits the housing is substantially the same across the entire length of front face. In a rotational processing system, the housing may be generally "pie-shaped" or "wedge-shaped". In a wedge-shaped segment, the width of the area that the plasma exits the housing changes to conform to a pie shape. As used in this specification and the appended claims, the terms "pie-shaped" and "wedge-shaped" are used interchangeably to describe a body that is a generally circular sector. For example, a wedge-shaped segment may be a fraction of a circle or disc-shaped component and may have a truncated point. The inner edge of the pie-shaped segment can come to a point or can be truncated to a flat edge or rounded. The path of the substrates can be perpendicular to the gas ports. In some embodiments, each of the gas injector assemblies comprises a plurality of elongate gas ports which extend in a direction substantially perpendicular to the path traversed by a substrate. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Additional embodiments of the disclosure are directed to methods of processing a plurality of substrates. The plurality of substrates is loaded onto substrate support in a processing chamber. The substrate support is rotated to pass each of the plurality of substrates across a gas distribution assembly to expose the substrate surface to the passivating agent, deposit a film on the substrate and, optionally, remove the passivation layer.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz, as well as in the GHz range, such as 2.45 GHz for the most common microwave generator. Although plasmas may be used during the deposition processes disclosed herein, plasmas may not be used. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A method of depositing a film, the method comprising:
   providing a substrate comprising a first substrate surface including a hydrogen-terminated surface and a second substrate surface including a non-hydrogen-terminated surface;
   exposing the substrate to a passivating agent to react with the hydrogen-terminated surface to form a passivated surface, the passivating agent comprising one or more of 1-octene, 1,4-cyclooctadiene, or trimethylvinylsilane; and
   exposing the substrate to one or more deposition gases to selectively deposit a film comprising one or more of SiN, TiO, TiN, TaN, or MnN on the second substrate surface relative to the passivated surface.

2. The method of claim 1, wherein the first substrate surface comprises silicon.

3. The method of claim 2, wherein the second substrate surface comprises one or more of SiO and/or SiN.

4. The method of claim 2, further comprising a third substrate surface, wherein the second substrate surface comprising SiO and the third substrate surface comprising SiN.

5. The method of claim 1, further comprising removing an oxide from the first substrate surface to produce the hydrogen-terminated surface.

6. The method of claim 5, wherein the oxide is a native oxide.

7. The method of claim 5, wherein removing the oxide from the first substrate surface comprises exposing the first substrate surface to dilute HF.

8. The method of claim 7, wherein the passivated surface comprises SiH and the second surface comprises SiOH.

9. The method of claim 1, wherein the film is deposited by atomic layer deposition comprising sequential exposure to a first reactive gas and a second reactive gas.

10. The method of claim 9, wherein the film comprises SiN.

11. The method of claim 10, wherein the first reactive gas comprises one or more of silane, disilane, trisilane, monochlorosilane, dichlorosilane, trichlorosilane, silicon tetrachloride, hexachlorodisilane (HCDS), a halogenated carbosilane.

12. The method of claim 11, wherein the second reactive gas comprises one or more of a nitrogen-containing plasma, ammonia, an amine, hydrazine and/or carbonitride.

13. A method of depositing a film, the method comprising:
    providing a substrate comprising a first substrate surface including a hydrogen-terminated surface and a second substrate surface including a non-hydrogen-terminated dielectric;
    exposing the substrate to a passivating agent to react with the hydrogen-terminated surface to form a passivated surface, the passivating agent comprising trimethylvinylsilane; and exposing to the substrate to one or more deposition gases to deposit a silicon nitride film on the second substrate surface selectively over the passivated surface.

14. The method of claim 13, wherein the passivating agent comprises trimethylvinylsilane.

15. The method of claim 14, wherein the silicon nitride film is deposited by sequential exposure of the substrate to a silicon-containing gas and a nitrogen-containing gas.

16. The method of claim 15, wherein the silicon-containing gas comprises silicon tetrachloride and the nitrogen-containing gas comprises ammonia.

17. A method of depositing a film, the method comprising:
providing a substrate comprising a first substrate surface and a second substrate surface;
exposing the substrate to dilute HF to remove an oxide from the first substrate surface to provide a hydrogen-terminated surface, the second substrate surface comprising a non-hydrogen-terminated surface;
exposing the substrate to a passivating agent to react with the hydrogen-terminated surface to form a passivated surface, the passivating agent comprising trimethylvinylsilane; and
sequentially exposing the substrate to a first reactive gas and a second reactive gas to selectively deposit a SiN film on the second substrate surface relative to the passivated surface, the first reactive gas comprising silicon tetrachloride and the second reactive gas comprising ammonia.

* * * * *